United States Patent [19]

Hoeksema et al.

[11] Patent Number: 4,802,953
[45] Date of Patent: Feb. 7, 1989

[54] CONTINUOUS ON-LINE CONDUCTIVITY PROBE

[75] Inventors: Scot D. Hoeksema, Elkridge; William H. Williams, Ellicott City, both of Md.

[73] Assignee: Westvaco Corporation, New York, N.Y.

[21] Appl. No.: 106,506

[22] Filed: Oct. 9, 1987

[51] Int. Cl.[4] .................. D21C 7/06; G01R 27/02
[52] U.S. Cl. ........................... 162/263; 162/49; 162/60; 324/65 P
[58] Field of Search ............... 162/49, 263, 60, 262; 324/65 CP, 61 P, 65 P

[56] References Cited

U.S. PATENT DOCUMENTS

| | | | |
|---|---|---|---|
| 3,553,075 | 1/1971 | Rivers | 162/49 |
| 3,607,083 | 9/1971 | Chowdhry | 162/49 |
| 4,449,396 | 5/1984 | Bzdula | 324/65 P |
| 4,560,440 | 12/1985 | Klein et al. | 162/60 |
| 4,591,793 | 5/1986 | Freilich | 324/65 P |

Primary Examiner—Steve Alvo

[57] ABSTRACT

Apparatus is disclosed for continuously measuring the conductivity of the liquor in a pulp mat on a pulp washer. The apparatus comprises a probe which rests on and squeezes washing liquor from the pulp mat. Two modifications of the probe are disclosed, one fixed and one rotatable. In each case, the probe comprises a pair of electrodes separated from one another by non-conducting material. The electrodes are arranged on the probes to be submerged within the washing liquor squeezed from the mat. The electrodes are connected to an energy source, and when current is applied to one electrode, the current flows through the liquor to the other electrode to complete an electrical circuit. The measurement of the current flow or the resistance to current flow is directly related to the conductivity of the liquor and can be correlated with the soda loss in the pulp washing step.

7 Claims, 3 Drawing Sheets

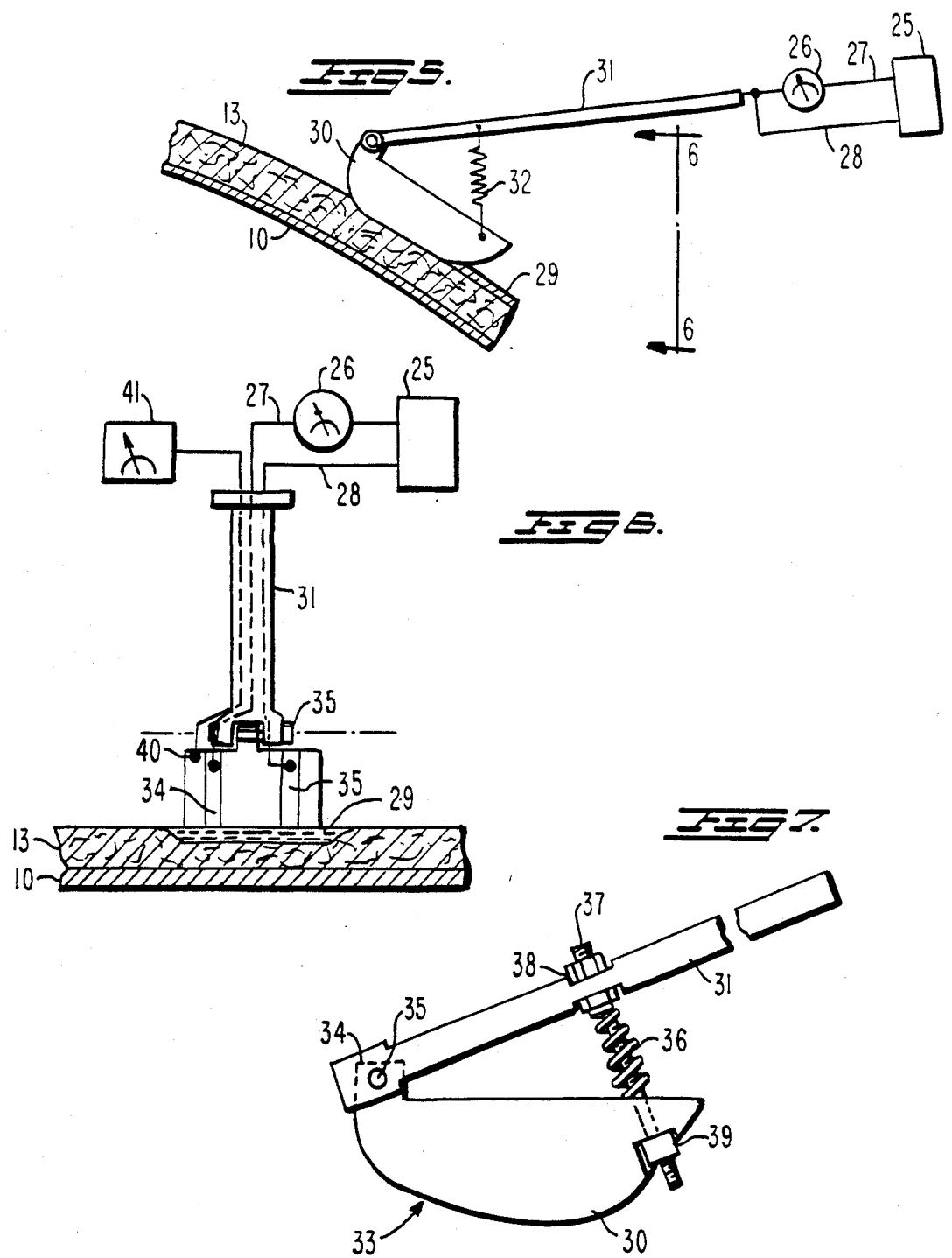

CONTINUOUS ON-LINE CONDUCTIVITY PROBE

BACKGROUND OF THE INVENTION

The present invention relates generally to a pulping process and more particularly to a pulp washing process and a method for controlling the process based on the conductivity of the liquor remaining in the washed pulp at different washing stages. Specifically, the present invention relates to a novel development in probes useful for measuring the conductivity of the liquor in the mat on a pulp washer. The invention is based on the observation that significant gains in economy and quality can be realized by measuring and controlling the soda loss in a pulp washing process continuously and automatically. Toward this end, the conductivity of the liquor remaining in the washed pulp has been found to show good correlation with soda loss in pulp washing, and is, therefore, an attractive control variable if measured correctly and continuously.

Additional background information may be found in prior U.S. Pat. Nos. 4,560,440 and 4,624,742, owned by the present assignee herein, and incorporated by reference in this disclosure. The present invention is an inprovement and/or alternative to the devices shown in the prior patents.

BRIEF SUMMARY OF THE INVENTION

Two embodiments of the present invention are disclosed. The first as illustrated in FIGS. 1-3 uses a probe in the form of a rotating disk assembly comprising two disk elements with electrically conducting surfaces joined to and separated by a centrally located third disk element. The disks are fixed relative to one another, but are free to rotate as an assembly about a central axis. The conductive surfaces of the disk assembly comprise electrodes which are connected to a power source by any suitable means so that a current may be passed from one conducting disk to the other. The disk assembly is mounted on a support arm for rotational movement. In operation, the disk assembly is pressed against the fiber mat on a washer drum with sufficient force so that washer liquor is expressed or squeezed out of the surface of the mat directly under the rotating disks. Current applied to one conducting disk passes through the expressed liquor to the other conducting disk to establish an electrical circuit. A conductivity signal is generated which may be displayed locally on a conductivity meter included in the circuit, or sent remotely to a suitable process control device.

In the second embodiment illustrated in FIGS. 4-7, the probe is in the form of a non-rotatable foot element, curved on one surface and connected by a hinge to a support arm. The probe may comprise a plastic block member including a pair of spaced electrodes which are electrically connected to a remote power source. In the preferred mode the block member is free to move with respect to the support arm but a spring assembly is used between the block member and the support arm to maintain contact between the electrodes and the fiber mat. In operation, the foot element is pressed against the fiber mat on a washer drum with sufficient force to express or squeeze wash liquor from the mat directly under the block member. Current applied to one of the electrodes in the block member passes through the expressed liquor to the other electrode to establish an electrical circuit. This action generates a conductivity signal directly, or a resistance signal indirectly, which may be displayed on a meter included in the circuit or sent remotely to a suitable process control device. If desired, this embodiment may also include a thermister or thermocouple in the foot element to provide temperature measurement of the expressed liquor. The temperature measurement is incorporated into the electrical circuit as a compensating means for the conductivity signal which is temperature dependent.

In either of the above described embodiments, the leads from the electrodes to the conductivity circuit are passed along the support arms in the most expeditious fashion. The leads are attached to the electrodes in any desired manner. With respect to the rotating probe, the leads may be attached to the electrodes with brushes or the like. With respect to the non-rotating probe, the electrodes may be attached to or embedded in the plastic block member and the leads fixedly attached thereto. The foregoing features of the invention may be more fully understood upon consideration of the following detailed description together with the accompanying drawings.

DESCRIPTION OF DRAWINGS

FIG. 5 is an enlarged view of the present invention as shown in FIG. 2, of the embodiment of the invention shown in FIG. 4;

FIG. 6 is an enlarged view of the FIG. 4 embodiment of the present invention taken in the direction of the arrows 6—6 shown in FIG. 5; and, FIG. 7 is a detailed view of the construction of the second embodiment of the probe of the present invention.

DETAILED DESCRIPTION

Figure 1:
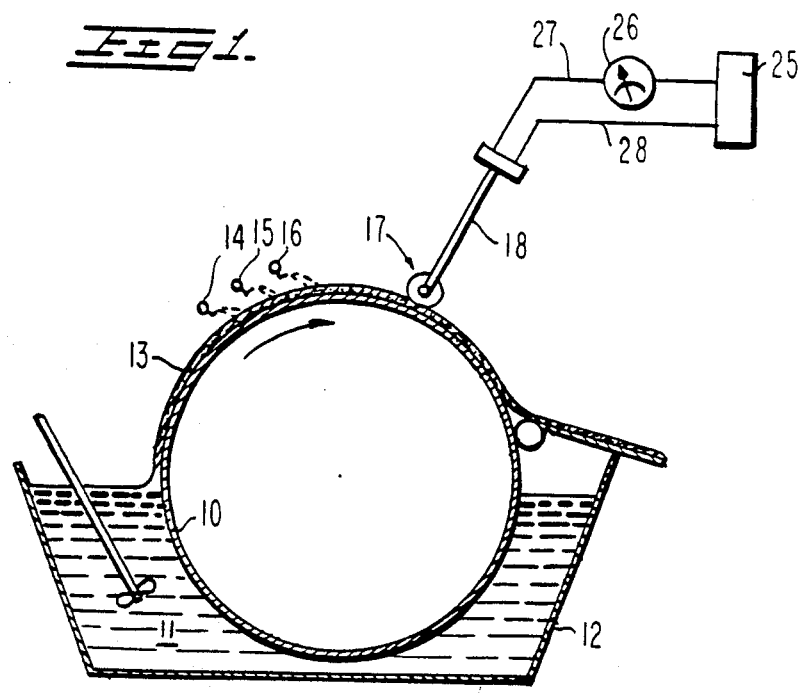
FIG. 1 is a schematic representation in elevation of a pulp washing drum with the probe of the present invention in place.

Referring in particular to FIG. 1 of the drawing, there is shown schematically a pulp washing apparatus in the form of a rotating, perforated drum 10, that is partially immersed in an aqueous suspension of pulp slurry 11 retained by a mixing tank 12. A partial vacuum induced within the drum causes a mat 13 of pulp to be retained on the drum 10 as it rotates within the tank 12. The filtrate or black liquor from the pulp slurry 11 passes through the perforations in drum 10 and in the process a partially dewatered mat 13 having a thickness of from about ¼ to 1 inch in thickness accumulates on the drum. As the mat is carried on the drum surface in the direction of rotation of the drum, a plurality of shower devices 14, 15 and 16 are positioned to spray wash liquor generally from another stage of the washing apparatus on the mat surface to wash additional black liquor from the pulp. As pointed out in prior U.S. Pat. Nos. 4,560,440 and 4,624,742, the degree to which black liquor remains in the mat matrix after washing defines the overall efficiency of the pulp washing apparatus. Further, since the relative percentage of the dissolved solids in the black liquor is directly proportional to the electrical conductivity of the solution, the instantaneous measurement of the conductivity of the solution may define the washing efficiency.

Figure 2:
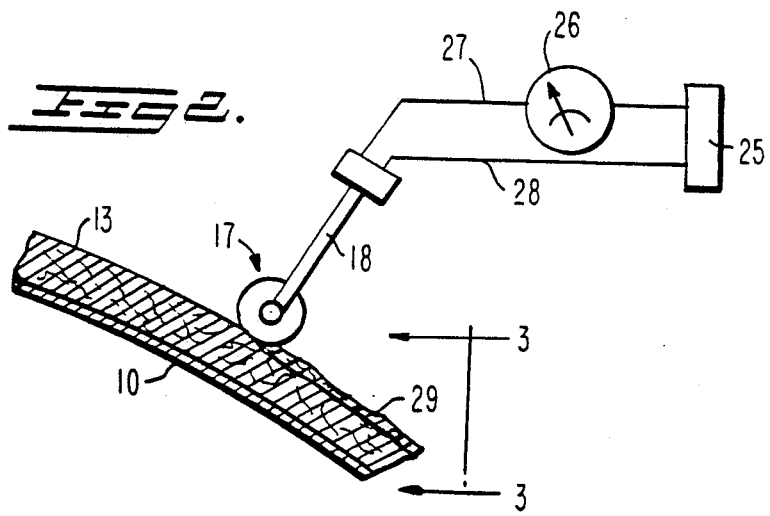
FIG. 2 is an enlarged view in elevation of the probe of the present invention and a section of the pulp washing apparatus.
Figure 3:
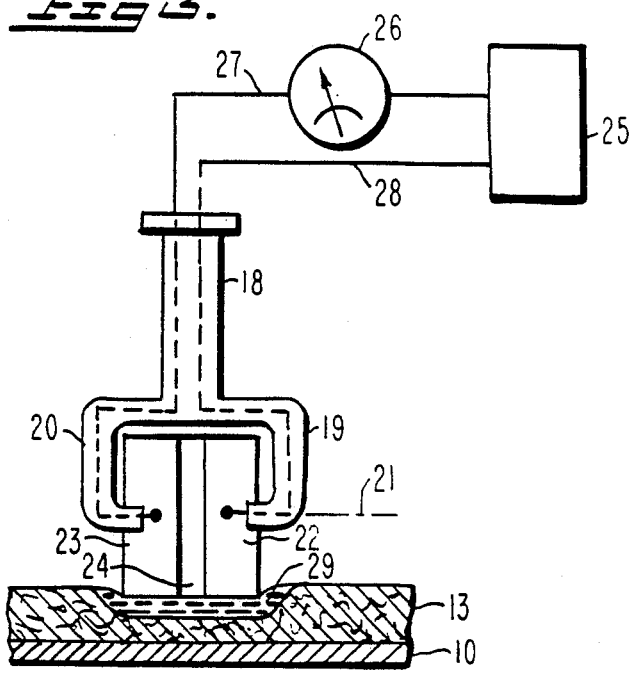
FIG. 3 is another enlarged view in elevation of the probe of the present invention and a section of the pulp washing apparatus taken from the direction of the arrows 3—3 in FIG. 2.
Figure 4:
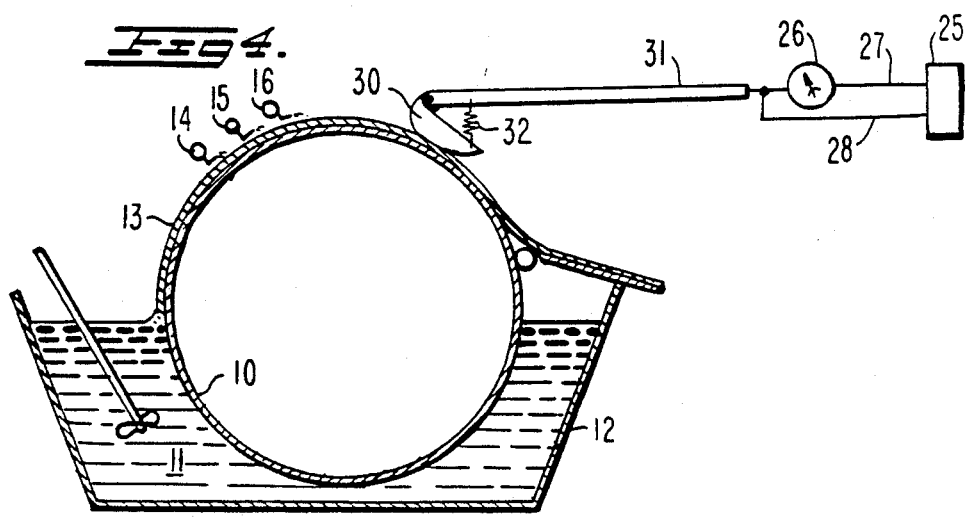
FIG. 4 is a schematic representation of the present invention as shown in FIG. 1 of a second embodiment of the present invention.

According to the embodiment of the present invention shown in FIGS. 1-3, the instantaneous conductivity of the black liquor in solution on the mat 13 is measured with the aid of a probe 17 mounted on a support arm 18. The probe 17 is arranged to be rotatably mounted on support arm 18 between a pair of yoke elements 19, 20 about a centrally located axis 21. The probe 17 comprises a pair of disk elements 22, 23 with electrically conductive surfaces joined to and separated by a centrally located disk 24 of non-conductive material. The specific materials of construction will depend upon the particular application, but in general the outside disk elements 22, 23 could have copper conductive surfaces or be constructed from pure copper, or a copper containing alloy, and the centrally located non-conductive disk 24 could be made of a plastic material, for example TEFLON plastic. The outside conductive disk elements 22, 23 are each connected electrically to a power source 25 via leads 27, 28 to form an electrical circuit containing a conductivity meter 26. The meter 26 may be calibrated to measure conductivity directly or indirectly as resistance. In operation, the probe 17 which is free to rotate about central axis 21 is pressed against the surface of the moving mat 13 with sufficient pressure to compress the fiber mat 13 and express or squeeze from the mat a quantity of black liquor containing liquid 29 directly under the disk assembly 22, 23, 24. When energy is applied from power source 25, current is conducted through the leads 27, 28 and passes through the liquid 29 from one conducting disk 22 to the other conducting disk 23 to complete an electrical circuit. This generates an electrical signal which is displayed locally at the meter 26. It should be understood, however, that this same signal could be directed to a suitable process control device in a manner well known in the art to control the washing function.

In the second embodiment of the present invention, the probe element 30 is in the form of a nonrotatable foot device. It is supported and pressed against the washer mat 13 by a support arm 31 and a spring device 22. The spring device 32 is preferably a compression coil spring or the like which provides a constant force between the probe 30 and the support arm 31. The probe device 30 may take any suitable shape, but is preferably a foot-shaped element with a curved leading edge 33 which enables it to ride smoothly on the mat 13 as the drum 10 turns. The probe may be constructed from any suitable nonconducting material such as a long wearing plastic, for example, TEFLON plastic. Embedded in the plastic probe 30 are a pair of conductive strips 34, 35 which are separated from one another a suitable distance to prevent leakage of current when energy from the power source 25 is applied to the circuit comprising lead lines 27, 28 and meter 26. Thus, as in the first embodiment, with the foot block 30 pressed against the fiber mat 13, a quantity of liquor 29 is expressed or squeezed from the mat directly beneath the mat 13. When energy is applied from power source 25, current is conducted through the liquor 29 from conductive strip 34 to conductive strip 35. This action completes the circuit and generates a signal at 26 which may represent the conductivity of the expressed liquor, or the efficiency of the washing process.

FIGS. 6 and 7 illustrate the details of construction of the second embodiment of the invention. Note that the foot block or probe 30 includes an integral bracket 34 for connection with the support arm 31 by a pin 35 or the like. Also, the spring device 32 shown in FIG. 7 may be seen to comprise a coil spring 36 situated between the foot block 30 and support arm 31 about a threaded shaft 37 which includes fittings 38, 39 for retaining it in place. The entire plastic block assembly 30 is preferably free to move about its hinge pin 35 and axis, but maximum deflection from the support arm is limited by the restraining shaft 37 to prevent the foot block 30 from contacting the screen or drum 10 when the mat 13 is disrupted. Meanwhile, the spring assembly 32 provides a constant force to insure good contact with the mat 13 when the mat is being collected on the drum. The conductive strips 34, 35 may be integrated into or arranged on the foot block 30 in any desired fashion, i.e., parallel with or perpendicular to the direction of rotation of the drum 10.

If desired, the embodiment of the invention shown in FIGS. 4-7 may also include a thermocouple element 40 for measuring the temperature of the wash liquor 29. For this purposes, a temperature gauge 41 may be connected to the thermocouple element 40 embedded in the plastic foot block 30. The temperature measurement provides a means of compensating the conductivity signal which is temperature dependent.

In the present invention, the conductivity probe may take one of two different forms. Experience has shown that the roller-type shown in FIGS. 1-3 gives the cleanest signal, but the sliding foot-type probe shown in FIGS. 4-7 is preferred for very wet pulp mats. In effect, the probes measure the conductivity of the liquid in contact with the electrically isolated halves of the roller or foot element, but experience has shown that this measurement correlates well with the bulk conductivity of the mat. The invention as illustrated uses a direct current power source, but it could readily be converted to an alternating current source by one skilled in the art of electrical circuitry.

Having fully disclosed the present invention and described the preferred embodiments, it will be appreciated by those skilled in the art that changes therein and different applications of the invention may be made employing the principles involved. It is therefore intended that the following claims be construed to give effect to a reasonable range of equivalent features and combinations defined thereby.

What is claimed is:

1. Apparatus for measuring the soda loss of a mat of fibrous pulp during washing as determined by the conductivity of the liquor in the pulp mat comprising:
   (a) a rotating filter screen having an outer surface;
   (b) a fibrous pulp mat containing liquor on the outer surface of said filter screen;
   (c) a support arm located adjacent to said filter screen;
   (d) a rotating conductivity probe mounted on said support arm for rotation about a central axis through said probe, said probe comprising a pair of electrodes in side-by-side relation, spaced from one another by a layer of non-conductive material, and bound to the non-conductive material, said electrode being spaced apart a distance sufficient to prevent inadvertent leakage of current across said non-conductive material;

(e) means associated with said support arm for urging said conductivity probe into intimate contact with said fibrous mat with sufficient force to express a portion of the liquor from the fibrous mat; and, (f) means for passing a current between said electrodes and through the liquor expressed from the fibrous mat to generate a signal corresponding to the instantaneous conductivity of said liquor.

2. The apparatus of claim 1 wherein said conductivity probe comprises a pair of conductive disks fixedly attached to either side of a centrally located non-conducting disk wherein all disks are of substantially the same diameter.

3. The apparatus of claim 2 wherein the disk conductivity probe has a width of about 10 cm, each of the conductive disks have a width of about 4 cm, the non-conductive disk has a width of about 2 cm and all disks are about 6 cm in diameter.

4. Apparatus for measuring the soda loss of a mat of fibrous pulp during washing as determined by the conductivity of the liquor in the pulp mat comprising:

(a) a rotating filter screen having an outer surface;

(b) a fibrous pulp mat containing liquor on the outer surface of said filter screen;

(c) a support arm located adjacent to said filter screen;

(d) a non-rotatable conductivity probe mounted on said support arm, said probe comprising a foot element with a curved outer surface constructed from a non-conductive material having embedded in the outer surface thereof a pair of electrodes in side-by-side relation, spaced from one another by the non-conductive material of said foot element, and bound to the non-conductive material, said electrodes being spaced apart a distance sufficient to prevent inadvertent leakage of current across said non-conductive material;

(e) means associated with said support arm for urging said foot element into intimate contact with said fibrous mat with sufficient force to express a portion of the liquor from the fibrous mat; and, (f) means for passing a current between said electrodes and through the liquor expressed from the fibrous mat to generate a signal corresponding to the instantaneous conductivity of said liquor.

5. The apparatus of claim 4 wherein the front section of the foot element is pivotally attached to its support arm and the rear portion of the foot element is biased away from the support arm by a spring device.

6. The apparatus of claim 5 wherein the electrodes are connected to an energy source for supplying current and measuring the conductivity of the pulp liquor.

7. The apparatus of claim 6 wherein the foot element includes a thermocouple in contact with the pulp liquor for measuring the temperature of the pulp liquor, said temperature measurement being incorporated into the circuitry for measuring the conductivity of the pulp liquor.

* * * * *